United States Patent [19]

Shenoi et al.

[11] Patent Number: 5,159,279
[45] Date of Patent: Oct. 27, 1992

[54] APPARATUS AND METHOD FOR DETECTING OUT-OF-LOCK CONDITION IN A PHASE LOCK LOOP

[75] Inventors: Kishan Shenoi, Milpitas; David J. Wetle, Santa Clara, both of Calif.

[73] Assignee: DSC Communications Corporation, Plano, Tex.

[21] Appl. No.: 618,675

[22] Filed: Nov. 27, 1990

[51] Int. Cl.[5] .......................... H03K 5/22; G06F 7/50
[52] U.S. Cl. .................................. 328/109; 328/110; 307/527; 307/528; 307/234; 307/471; 331/1 A; 331/27
[58] Field of Search ................ 307/527–528, 307/234, 471; 328/109–110; 331/1 A, 27

[56] References Cited

U.S. PATENT DOCUMENTS

| | | | |
|---|---|---|---|
| 4,267,514 | 5/1981 | Kinsey | 307/528 |
| 4,385,395 | 5/1983 | Tanaka et al. | 307/528 |
| 4,400,667 | 8/1983 | Belkin | 331/1 A |
| 4,422,176 | 12/1983 | Summers | 331/1 A |
| 4,535,459 | 8/1985 | Hogge, Jr. | 331/1 A |
| 4,574,243 | 3/1986 | Levine | 328/155 |
| 4,668,917 | 5/1987 | Levine | 328/133 |
| 4,775,840 | 10/1988 | Ohmori et al. | 307/234 |
| 4,988,901 | 1/1991 | Kamuro et al. | 328/109 |
| 5,027,085 | 6/1991 | De Vito | 331/1 A |

Primary Examiner—Stanley D. Miller
Assistant Examiner—Margaret Rose Wambach
Attorney, Agent, or Firm—Baker & Botts

[57] ABSTRACT

A circuit is provided for detecting out-of-lock condition in a phase lock loop. The phase lock loop receives a first signal having a first frequency and a voltage controlled oscillator of the phase lock loop produces a second signal having a second frequency. The circuit comprises a first data flip-flop coupled to the phase lock loop for receiving the first signal and clocked by the second signal. The first flip-flop produces an inverted output of the first signal. A second flip-flop is coupled to the phase lock loop for receiving the second signal clocked by the first signal, and produces a non-inverted output of the second signal. Additionally, an EXCLUSIVE-OR gate is coupled to the first and second flip-flops for receiving the inverted and non-inverted output thereof and producing a signal indicative of an out-of-lock condition.

17 Claims, 1 Drawing Sheet

APPARATUS AND METHOD FOR DETECTING OUT-OF-LOCK CONDITION IN A PHASE LOCK LOOP

TECHNICAL FIELD OF THE INVENTION

This invention relates in general to the field of phase lock loop circuits. More particularly, the present invention relates to apparatus and method for detecting out-of-lock condition in a phase lock loop.

BACKGROUND OF THE INVENTION

The phase lock loop is an essential component in many circuit applications where signal tracking is desired. A typical phase lock loop is a circuit containing an oscillator whose output phase and/or frequency is steered to keep it synchronous with the frequency of a reference signal. When the oscillator output is synchronous with the reference frequency, the phase lock loop is said to be in lock. Conversely, when the reference signal and the oscillator output differ in frequency by more than a predetermined amount, the phase lock loop is out of lock.

Therefore, it is desirable to determine when the phase lock loop is operating in an out-of-lock condition, so that certain loop parameters may be modified to allow the phase lock loop to reacquire lock. Additionally, circuits using the output of the phase lock loop may require notice of the out-of-lock condition to prevent erroneous operations.

SUMMARY OF THE INVENTION

In one aspect of the present invention, a circuit is provided for detecting out-of-lock condition in a phase lock loop. The phase lock loop receives a first signal having a first frequency. A voltage controlled oscillator of the phase lock loop produces a second signal having a second frequency. The circuit comprises a first data flip-flop coupled to the phase lock loop for receiving the first signal and clocked by the second signal. The first flip-flop produces an inverted output of the first signal. A second data flip-flop is coupled to the phase lock loop for receiving the second signal clocked by the first signal, and producing a non-inverted output of the second signal. Additionally, an exclusive-OR gate is coupled to the first and second data flip-flops for receiving the inverted and non-inverted output thereof and producing a signal indicative of an out-of-lock condition.

In another aspect of the present invention, a circuit is provided for detecting out-of-lock condition in a phase lock loop. The phase lock loop receives a first signal having a first frequency. A voltage controlled oscillator of the phase lock loop produces a second signal having a second frequency. The circuit comprises a first data flip-flop coupled to the phase lock loop for receiving the first signal clocked by the second signal, and producing a first output signal. A second data flip-flop is coupled to the first data flip-flop for receiving the first output signal clocked by the second signal, and producing a second output signal. An exclusive-OR gate receives the first and second output signals and produces an output signal indicative of an out-of-lock condition.

An important technical advantage of the present invention provides for detecting of an out-of-lock condition in a phase lock loop.

BRIEF DESCRIPTION OF THE DRAWINGS

For a better understanding of the present invention, reference may be made to the accompanying drawings, in which.

DETAILED DESCRIPTION OF THE INVENTION

Figure 1:
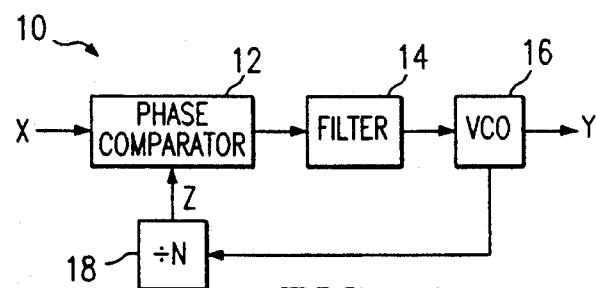
FIG. 1 is a block diagram of a conventional phase lock loop circuit.

With reference to the drawings, FIG. 1 illustrates a conventional phase lock loop circuit 10 including a phase comparator 12, a filter 14, a voltage controlled oscillator (VCO) 16 and a divide-by-N circuit 18 coupled in a closed loop configuration as known in the art. The function of phase lock loop 10 is to produce an output signal Y with a frequency $f_o$ that is equal to $Nf_i$, where $f_i$ is the frequency of a reference signal X. A signal Z is produced by divide-by-N circuit 18 and provides a feedback signal to phase comparator circuit 12. For the following description of the present invention, phase comparator 12 is assumed to be level sensitive. In other words, phase comparator 12 determines the phase of each signal by detecting the logic level of the signals rather than the rising or falling edges. Minor modifications devisable by a person skilled in the art may be required to adapt the present invention to a phase lock loop having edge sensitive phase comparators.

Figure 2:
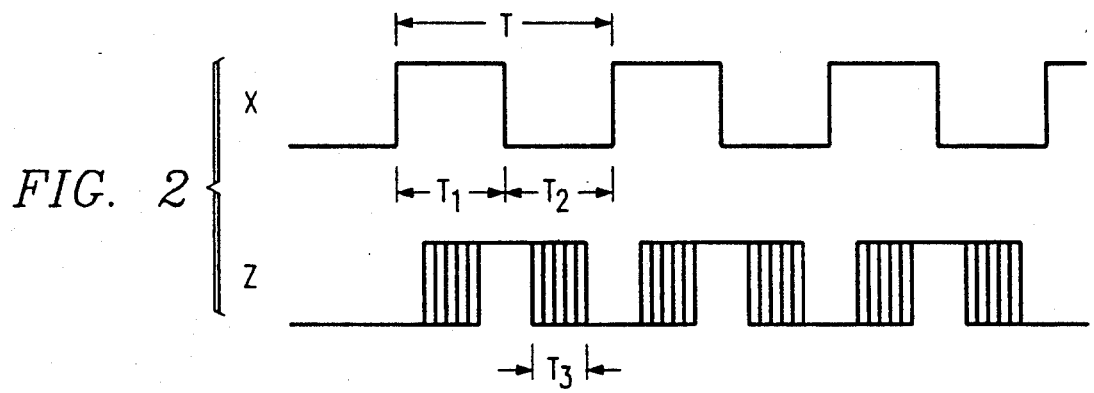
FIG. 2 is a timing diagram of two signals X and Z associated with the phase lock loop circuit illustrating the timing relationship thereof.

Referring to FIG. 2 for a timing diagram of signals X and Z. Signals X and Z are shown to have a period of T, and $T_1$ and $T_2$ further describe the duty cycle thereof. It is assumed herein for simplicity that X and Z are approximately 50% duty cycle signals, i.e. $T_1 \simeq T_2$. When phase lock loop 10 is in lock, signals X and Z are stable relative to one another as the rising edge of signal Z occurs within a time period $T_3$ of the rising edge of signal X, where $T_3 < T_1$. When phase lock loop 10 is out of lock, the rising edge of signal Z drifts either to the left or right past the rising edge of signal X, depending on whether the frequency of Y is either too high or too low.

Figure 3:
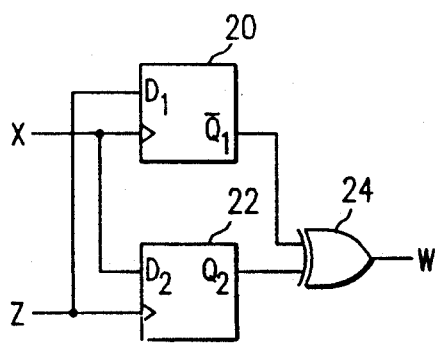
FIG. 3 is a logic diagram of a preferred embodiment of the present invention.

Referring to FIG. 3, an embodiment of the present invention is shown. Signals Z and X are provided as inputs to a first and second data flip-flop 20 and 22 or circuits performing similar function, respectively. In addition, signals X and Z also serve as clock signals for data flip-flops 20 and 22, respectively. First and second flip-flops 20 and 22 may be implemented to be sensitive to either the rising or falling edges of the clock signals. The inverted output $\bar{Q}_1$ of first data flip-flop 20 is coupled to an input of an exclusive-OR gate 24. The non-inverted output $Q_2$ of second data flip-flop 22 is coupled to another input of exclusive-OR gate 24. Exclusive-OR gate 24 produces a signal W at its output.

In operation, the circuit shown in FIG. 3 will produce a high logic level at signal W whenever the rising edge of one signal slips past that of the other, if flip-flops 20 and 22 are rising edge-sensitive. Alternatively, if flip-flops 20 and 22 are falling edge-sensitive, signal W will be high whenever the falling edge of one signal slips past that of the other.

Figure 4:
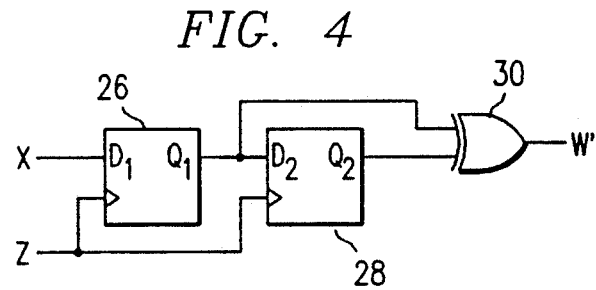
FIG. 4 is a logic diagram of an alternate embodiment of the present invention.

Referring to FIG. 4, a data flip-flop 26 or a logic circuit performing similar function receives signal X at the data input and signal Z at the clock input. The non-inverted output $Q_1$ of first flip-flop 26 is coupled to the input of a second data flip-flop 28 or a circuit performing similar function. Second data flip-flop 28 also receives signal Z as a clock input. The non-inverted outputs of first data flip-flop 26 and second data flip-flop 28 are coupled to first and second inputs of an exclusive-OR gate 30. Exclusive-OR gate 30 produces a signal W'.

In operation, if phase lock loop 10 is in lock, then the rising edge of signal Z will always occur when signal X is either high or low. Flip-flops 26 and 28 maintain the value of signal X at the two most recent rising edges of signal Z. If the rising edge of either signal slips past the other, the values stored in flip-flops 26 and 28 will differ from one another and thus cause a high level to be produced at W'.

Due to non-ideal characteristics of the hardware, in certain instances phase lock loop 10 may be in lock, but the rising edges of signals X and Z may occur close enough to violate the setup and hold time requirements of the data flip-flops, causing a false indication of the out-of-lock condition at signals W or W'. Such false indications may be instantaneous and produce glitches in the indicator signal W or W'.

Figure 5:
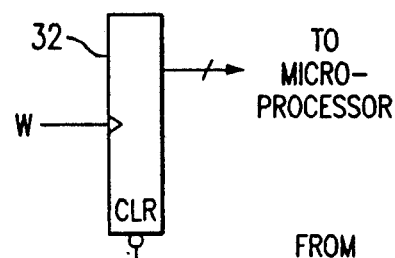
FIG. 5 is a logic diagram of an auxiliary portion of the present invention.

Referring to FIG. 5, an intelligent device such as a microprocessor may be used to differentiate true and false out-of-lock indications. Signal W or W' is supplied to a counter 32 which counts the number of occurrences of high signal W or W'. A count is produced and supplied to the microprocessor (not shown). Counter 32 may additionally receive a signal from the microprocessor which resets the counter.

In operation, a predetermined count setpoint may be used to compare with the count output from counter 32. If the count is greater than the predetermined count setpoint, then phase lock loop 10 is out of lock. Otherwise, if the count is less than the count setpoint, phase lock loop 10 is probably operating marginally and maintenance actions should be taken to correct it.

Although the present invention has been described in detail, it should be understood that various changes, substitutions and alterations can be made hereto without departing from the spirit and scope of the present invention as defined by the appended claims.

What is claimed is:

1. A circuit for detecting out-of-lock condition in a phase lock loop, said phase lock loop receiving a first signal having a first frequency and including a voltage controlled oscillator, said voltage controlled oscillator producing a second signal having a second frequency, said circuit comprising:
   a first flip-flop coupled to said phase lock loop for receiving said first signal clocked by said second signal, and producing an inverted output of said first signal;
   a second flip-flop coupled to said phase lock loop for receiving said second signal clocked by said first signal, and producing a non-inverted output of said second signal; and
   a logic circuit for receiving said inverted and non-inverted output and producing an out-of-lock signal indicative of an out-of-lock condition.

2. The circuit, as set forth in claim 1, further comprising a counter coupled to said logic circuit for receiving said out-of-lock signal at a clocking input, and producing a count of the number of occurrences of said out-of-lock signal.

3. The circuit, as set forth in claim 2, further comprising a microprocessor coupled to said counter for receiving said count of the number of said out-of-lock signal occurrences.

4. The circuit, as set forth in claim 3, wherein said microprocessor further produces a clear signal for resetting said counter.

5. The circuit, as set forth in claim 1, wherein said first and second signals have rising and falling edges, said first flip-flop receives said first signal at the rising edge of said second signal, and said second flip-flop receives said second signal at the rising edge of said first signal.

6. The circuit, as set forth in claim 1, wherein said first and second signals have rising and falling edges, said first flip-flop receives said first signal at the falling edge of said second signal, and said second flip-flop receives said second signal at the falling edge of said first signal.

7. The circuit, as set forth in claim 1, wherein said first and second flip-flops are edge sensitive data flip-flops.

8. The circuit, as set forth in claim 1, wherein said logic circuit performs an exclusive-OR function.

9. The circuit, as set forth in claim 1, wherein said logic circuit is an exclusive-OR gate.

10. A circuit for detecting out-of-lock condition in a phase lock loop, said phase lock loop receiving a first signal having a first frequency and including a voltage controlled oscillator, said voltage controlled oscillator producing a second signal having a second frequency, said circuit comprising:
    first means coupled to said phase lock loop for receiving said first signal clocked by said second signal and producing an inverted output of said first signal;
    second means coupled to said phase lock loop for receiving said second signal clocked by said first signal, and producing a non-inverted output of said second signal; and
    logic means for receiving said inverted and non-inverted outputs and producing an out-of-lock signal indicative of an out-of-lock condition whenever only one of said inverted and non-inverted outputs is high.

11. The circuit, as set forth in claim 10, further comprising counting means coupled to said logic means for receiving said out-of-lock signal at a clocking input, and producing a count of the number of occurrence of said out-of-lock signal.

12. The circuit, as set forth in claim 11, further comprising processing means coupled to said counting means for receiving said count of said the number of out-of-lock signal occurrences.

13. The circuit, as set forth in claim 12, wherein said processing means further produces a clear signal for resetting said counting means.

14. The circuit, as set forth in claim 10, wherein said first and second signals have rising and falling edges, said first means receives said first signal at the rising edge of said second signal, and said second means receives said second signal at the rising edge of said first signal.

15. The circuit, as set forth in claim 10, wherein said first and second signals have rising and falling edges, said first means receives said first signal at the falling edge of said second signal, and said second means receives said second signal at the falling edge of said first signal.

16. The circuit, as set forth in claim 10, wherein said first and second means are data flip-flops.

17. The circuit, as set forth in claim 10, wherein said logic circuit is an exclusive-OR gate.

* * * * *